(12) United States Patent
Wu et al.

(10) Patent No.: US 9,761,594 B2
(45) Date of Patent: Sep. 12, 2017

(54) HARDMASK FOR A HALO/EXTENSION IMPLANT OF A STATIC RANDOM ACCESS MEMORY (SRAM) LAYOUT

(71) Applicant: GLOBALFOUNDRIES Inc., Grand Cayman (KY)

(72) Inventors: Xusheng Wu, Hopewell Junction, NY (US); Bingwu Liu, Ballston Spa, NY (US); Randy Mann, Milton, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 71 days.

(21) Appl. No.: 14/043,871

(22) Filed: Oct. 2, 2013

(65) Prior Publication Data

US 2015/0091097 A1 Apr. 2, 2015

(51) Int. Cl.
| | |
|---|---|
| *H01L 27/11* | (2006.01) |
| *H01L 21/265* | (2006.01) |
| *H01L 27/088* | (2006.01) |
| *H01L 21/8234* | (2006.01) |
| *H01L 29/66* | (2006.01) |
| *H01L 27/02* | (2006.01) |
| *H01L 21/266* | (2006.01) |
| *H01L 29/78* | (2006.01) |

(52) U.S. Cl.
CPC ........ *H01L 27/1104* (2013.01); *H01L 21/266* (2013.01); *H01L 21/26586* (2013.01); *H01L 21/823431* (2013.01); *H01L 27/0207* (2013.01); *H01L 27/0886* (2013.01); *H01L 29/66803* (2013.01); *H01L 29/785* (2013.01)

(58) Field of Classification Search
CPC ........... H01L 27/1104; H01L 21/26586; H01L 21/823431; H01L 27/0886
See application file for complete search history.

(56) References Cited

U.S. PATENT DOCUMENTS

| | | | |
|---|---|---|---|
| 6,372,587 B1 | 4/2002 | Cheek et al. | |
| 6,489,223 B1 * | 12/2002 | Hook | ................ H01L 21/26586 257/E21.345 |
| 2010/0109086 A1 * | 5/2010 | Song | ..................... H01L 29/785 257/365 |
| 2012/0329220 A1 * | 12/2012 | van Bentum | ....... H01L 27/1104 438/232 |
| 2013/0026567 A1 | 1/2013 | Merelle et al. | |

* cited by examiner

*Primary Examiner* — Marcos D Pizarro
*Assistant Examiner* — Sue Tang
(74) *Attorney, Agent, or Firm* — Williams Morgan, P.C.

(57) ABSTRACT

Approaches for providing a hardmask used during a halo/extension implant of a static random access memory (SRAM) layout for a semiconductor device are disclosed. Specifically, approaches are provided for forming a pull-down (PD) transistor over a substrate; forming a pass-gate (PG) transistor over the substrate; and patterning a hardmask over the device, the hardmask including a first section adjacent the PD transistor and a second section adjacent the PG transistor, wherein a distance between the first section and the PD transistor is shorter than a distance between the second section and the PG transistor. The respective distances between the first section and the PD transistor, and the second section and the PG transistor, are selected to prevent a halo/extension implant from impacting one side of the PD transistor, while allowing the halo/extension implant to impact both sides of the PG transistor.

8 Claims, 4 Drawing Sheets

HARDMASK FOR A HALO/EXTENSION IMPLANT OF A STATIC RANDOM ACCESS MEMORY (SRAM) LAYOUT

BACKGROUND

Technical Field

This invention relates generally to the field of semiconductors, and more particularly, to a hardmask used during a halo/extension implant of a SRAM layout for a semiconductor device.

Related Art

A typical integrated circuit (IC) chip includes a stack of several levels or sequentially formed layers of shapes. Each layer is stacked or overlaid on a prior layer and patterned to form the shapes that define devices (e.g., field effect transistors (FETs)) and connect the devices into circuits. In a typical state of the art complementary insulated gate FET process, such as what is normally referred to as CMOS, layers are formed on a wafer to form the devices on a surface of the wafer. Further, the surface may be the surface of a silicon layer on a silicon on insulator (SOI) wafer. A simple FET is formed by the intersection of two shapes, a gate layer rectangle on a silicon island formed from the silicon surface layer. Each of these layers of shapes, also known as mask levels or layers, may be created or printed optically through well known photolithographic masking, developing and level definition, e.g., etching, implanting, deposition, etc.

The FinFET is a transistor design that attempts to overcome the issues of short-channel effect encountered by deep submicron transistors, such as drain-induced barrier lowering (DIBL). Such effects make it harder for the voltage on a gate electrode to deplete the channel underneath and stop the flow of carriers through the channel—in other words, to turn the transistor off. By raising the channel above the surface of the wafer instead of creating the channel just below the surface, it is possible to wrap the gate around all but one of its sides, providing much greater electrostatic control over the carriers within it.

In FinFET technology, device width is defined by fin height and fin number. A 1-1-1 fin type static random access memory (SRAM) cell layout design (i.e., one fin for each pull-down (PD) transistor, pass-gate (PG) transistor, and pull-up (PU) transistor) is desired to achieve a high SRAM cell density. This intrinsically provides a beta ratio (i.e., current (I) ratio of PD/PG) of 1 for FinFET technology based SRAM designs. In standard SRAM designs, a beta ratio >1 is desirable for cell stability. However, it is difficult to tune fin height or use different fin numbers for PD transistors and PG transistors.

Currently, there are two common methods used in an attempt to achieve this the desired beta ratio in SRAM designs. The first method provides different channel widths for PD transistors and PG transistors, while the second method provides an extra channel implant mask for the PG transistor to generate a different PG transistor threshold voltage (Vt). However, adding an extra mask for PG Vt tuning adds additional processing steps, and will induce a different Vt for the PD transistor and PG transistor due to different channel doping levels.

It is further known that during processing, halo/extension implants need to be implanted into the vertical fins at an angle. However, due to the small distances between N and P-type fins in the SRAM layout, the mask blocking effect makes the angled implant difficult. Current approaches focus mainly on reducing implant tilt angles. However, this approach limits implant dosing and/or the engineering design window. Plasma implantation is another current art approach used, but is also undesirable because it suffers from negative process variations.

SUMMARY

In general, approaches for providing a hardmask used during a halo/extension implant of a SRAM layout for a semiconductor device are disclosed. Specifically, approaches are provided for forming a pull-down (PD) transistor over a substrate; forming a pass-gate (PG) transistor over the substrate; and patterning a hardmask over the device, the hardmask including a first section adjacent the PD transistor and a second section adjacent the PG transistor, wherein a distance between the first section and the PD transistor is shorter than a distance between the second section and the PG transistor. The respective distances between the first section and the PD transistor, and the second section and the PG transistor, are selected to prevent a halo/extension implant from impacting one side of the PD transistor, while allowing the halo/extension implant to impact both sides of the PG transistor. As such, the PD and PG transistors will have an in-situ threshold voltage (Vt) delta due to the halo dose difference, wherein the delta can be optimized through different combinations of implant dose, engineering design window, implant angle, etc.

One aspect of the present invention includes a device, comprising: a pull-down (PD) transistor formed over a substrate; a pass-gate (PG) transistor formed over the substrate; and a hardmask formed over the device, the hardmask including a first section adjacent the PD transistor and a second section adjacent the PG transistor, wherein a distance between the first section and the PD transistor is shorter than a distance between the second section and the PG transistor.

Another aspect of the present invention includes a fin field effect transistor (FinFET) device, comprising: a pull-down (PD) transistor formed over a substrate; a pass-gate (PG) transistor formed over the substrate; and a hardmask formed over the device, the hardmask including a first section adjacent the PD transistor and a second section adjacent the PG transistor, wherein a distance between the first section and the PD transistor is shorter than a distance between the second section and the PG transistor.

Yet another aspect of the present invention includes a method for forming a hardmask for a halo/extension implant of a static random access memory (SRAM) layout for a semiconductor device, the method comprising: forming a pull-down (PD) transistor over a substrate; forming a pass-gate (PG) transistor over the substrate; and patterning a hardmask over the device, the hardmask including a first section adjacent the PD transistor and a second section adjacent the PG transistor, wherein a distance between the first section and the PD transistor is shorter than a distance between the second section and the PG transistor.

BRIEF DESCRIPTION OF THE DRAWINGS

These and other features of this invention will be more readily understood from the following detailed description of the various aspects of the invention taken in conjunction with the accompanying drawings in which.

Figure 1:
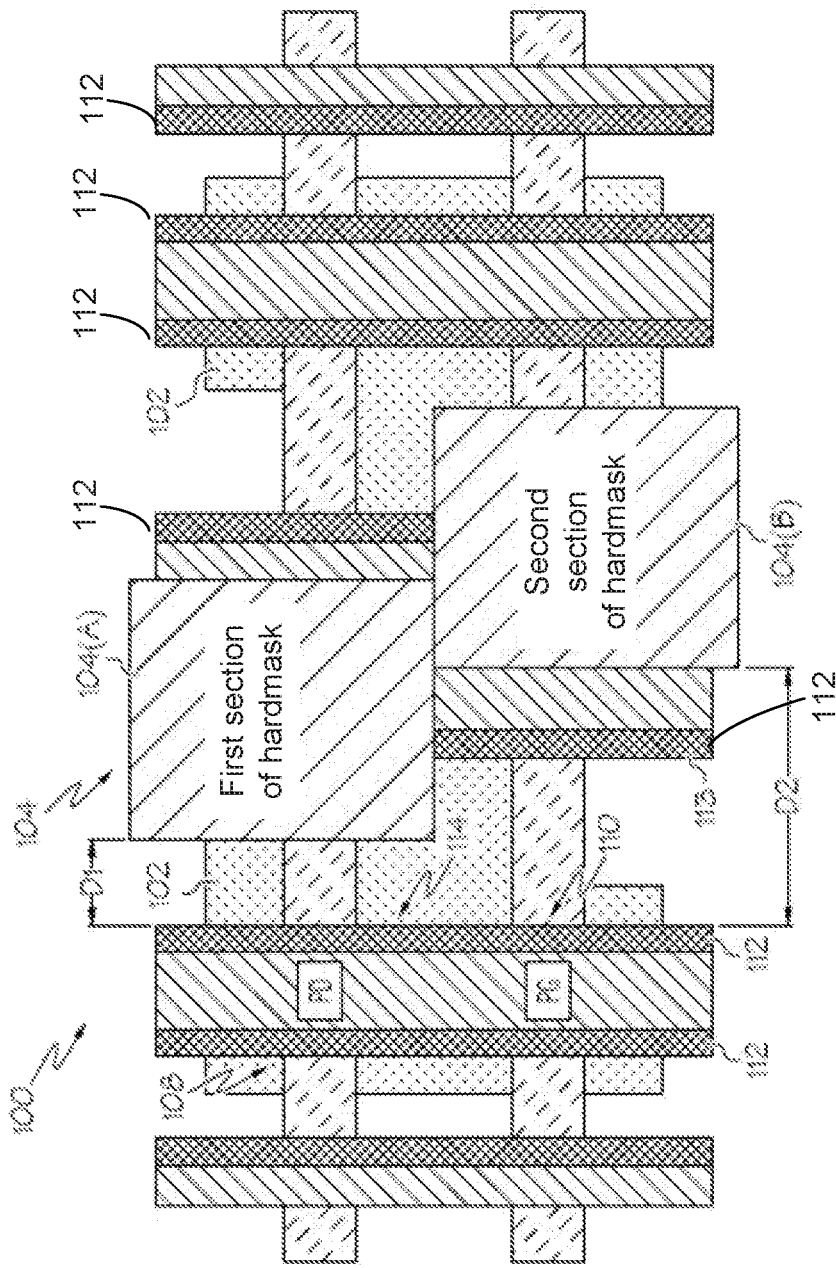
FIG. 1 shows a top view of a SRAM layout of a semiconductor device according to illustrative embodiments.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines, which would otherwise be visible in a "true" cross-sectional view, for illustrative clarity. Furthermore, for clarity, some reference numbers may be omitted in certain drawings.

DETAILED DESCRIPTION

Exemplary embodiments will now be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

Described herein are approaches for providing a hardmask used during a halo/extension implant of a SRAM layout for a semiconductor device. Specifically, approaches are provided for forming a pull-down (PD) transistor over a substrate; forming a pass-gate (PG) transistor over the substrate; and patterning a hardmask over the device, the hardmask including a first section adjacent the PD transistor and a second section adjacent the PG transistor, wherein a distance between the first section and the PD transistor is shorter than a distance between the second section and the PG transistor. The respective distances between the first section and the PD transistor, and the second section and the PG transistor, are selected to prevent a halo/extension implant from impacting one side of the PD transistor, while allowing the halo/extension implant to impact both sides of the PG transistor. As such, the PD and PG transistors will have an in-situ threshold voltage (Vt) delta due to the halo dose difference, wherein the delta can be optimized through different combinations of implant dose, engineering design window, implant angle, etc.

The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LP-CVD), plasma-improved CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation, etc.

Referring now to the figures, FIG. 1 shows a top view of a device 100 according to an embodiment of the invention. Device 100 (e.g., a FinFET device) comprises a substrate 102, and a hardmask 104 formed over substrate 102. The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion or entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain.

Device 100 further comprises a pull-down (PD) transistor 108 and a pass-gate (PG) transistor 110 formed over a set of fins 112 of device 100. In this embodiment, PD transistor 108 is formed over substrate 102 (e.g., a p-type substrate) and includes a gate oxide layer and a gate structure made of polysilicon (not shown). PD transistor 108 may further include a silicon oxide conformally formed on the gate structure and the exposed surface of the gate oxide, a set of spacers at the sidewall of the gate structure, a source region, and a drain region. PG transistor 110 comprises a gate, a channel region, a source region, and a drain region (also not specifically shown for the sake of brevity). Many of the details of forming PD transistor 108 and PG transistor 110 are well-known, and are omitted for brevity. Furthermore, it will be appreciated that the exemplary layout shown in FIG. 1 is in no way limiting. For example, in this embodiment, a 2-2-1 design is shown, which means PD 108 has 2 fins, PG 110 has 2 fins and a pull-up (PU) gate 113 has 1 fin. However, in other embodiments, the invention can extend to any number of FinFET based SRAM designs with different fin (i.e., PD-PG-PU) combinations (e.g., 1-1-1, 2-2-1, 3-3-1, 2-2-2, 3-3-2, etc.).

As shown, hardmask 104 is asymmetric, and comprises a first section 104(a) and a second section 104(b). In one embodiment, first section 104(a) is positioned adjacent (e.g., to the right of) PD transistor 108, and second section 104(b) is positioned adjacent PG transistor 110. In this configuration, a distance D1 between first section 104(a) and PD transistor 108 is shorter than a distance D2 between second section 104(b) and PG transistor 110. As will be described in further detail below, distance D1 is selected to prevent a halo/extension implant from impacting a first side 114 of PD transistor 108.

Hardmask 104 may comprise either silicon nitride (SiN) or silicon dioxide (SiO2), or any other material(s) suitable as a hardmask, including silicon oxynitride (SiON), silicon oxycarbide (SiOC), and the like. Hardmask 104 can be prepared by PVD, CVD, spin coating, etc., depending on the material. The material(s) of hardmask 104 is patterned using photolithography and etch processes. More specifically, a removal pattern is produced by applying a photoresist (PR) (not shown) to the surface of hardmask 104, exposing the PR to a pattern of radiation, and then developing the pattern into the PR utilizing a resist developer. Once the patterning of the PR is completed, the sections covered by the photoresist are protected while the exposed regions of hardmask 104 are removed using a selective etching process that removes the unprotected regions. The term "selective" in reference to a material removal process denotes that the rate of material removal for a first material is greater than the rate of removal for at least another material of the structure to which the material removal process is being applied. The PR may be removed using an $O_2$ ash process, or it may be stripped using a wet chemical process. In another embodiment, the PR itself can serve as the hardmask, because the PR height is high (e.g., >200 nm), and may be easier to achieve than other HM materials, such as oxide/nitride.

Figure 2:
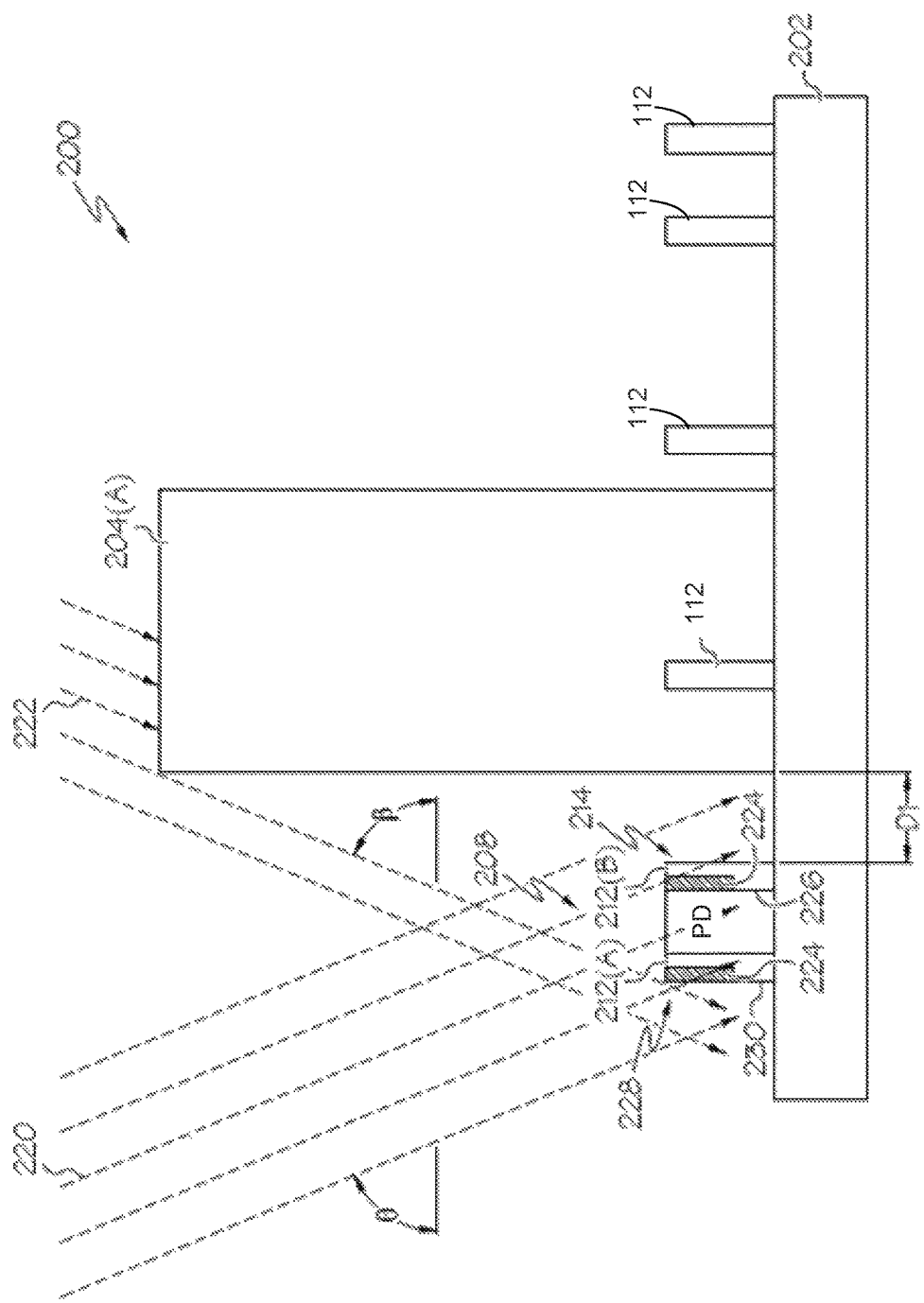
FIG. 2 shows a cross-sectional view of a first section of a hardmask and a halo/extension implant according to illustrative embodiments.

Turning now to FIG. 2, a cross-section through PD transistor 208 and first section 204(a) is shown. As demonstrated, device 200 is implanted during processing with a first implant 220 at a first angle θ, and a second implant 222 at a second angle β to form halo/extension implant areas 224 in PG transistor 208. In this embodiment, first section 204(a) is configured to allow first implant 220 to impact first side 214 (e.g., at an inner surface 226 of fin 212(B)) and a second side 228 (e.g., at an outer surface 230 of fin 212(A)) of PD transistor 208. Meanwhile, second implant 222 does not impact any of PD transistor, including first side 214, due to the height and position of first section 204(a).

Figure 3:
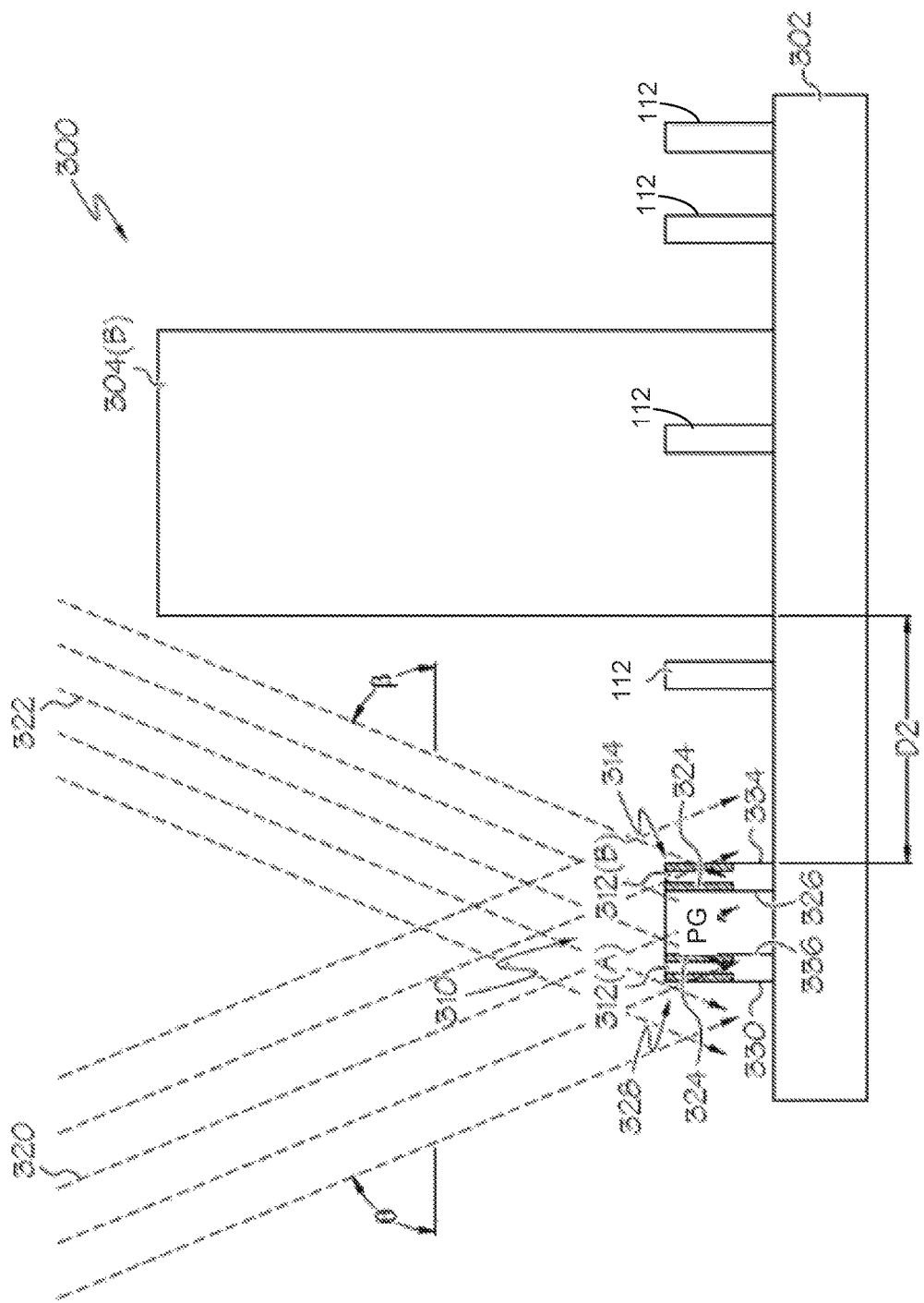
FIG. 3 shows a cross-sectional view of a second section of the hardmask and the halo/extension implant according to illustrative embodiments.

Turning now to FIG. 3, a cross-section through PG transistor 310 and second section 304(b) is shown. As demonstrated, device 300 is implanted during processing with first implant 320 at first angle θ, and second implant 322 at second angle β to form halo/extension implant areas 324 in PG transistor 310. In this embodiment, second section 304(b) is configured to allow first implant 320 to impact first side 314 (e.g., at an inner surface 326 of fin 312(B)) and second side 328 (e.g., at an outer surface 330 of fin 312(A)) of PG transistor 310. Meanwhile, second implant 322 is able to impact first side 314 (e.g., at an outer surface 334 of fin 312(B)) and second side 328 (e.g., at an inner surface 336 of fin 312(A)) of PG transistor 310. Due to the distance D2, which is greater than the distance D1 (shown in FIG. 2), second implant 322 is able to impact both first side 314 and second side 328, resulting in halo/extension areas 324 formed on each side of fins 312(A)-(B).

As a result, at least the following benefits are achieved using this asymmetric hardmask and implant approach. First, because the PD transistor is blocked from the halo/extension implant from one side, yet the PG transistor receives the halo/extension implant from two sides, the PD/PG transistors will have in-situ Vt delta due to halo/extension dose difference of 1-side vs. 2-side implantation. This Vt delta can be optimized by adjusting implant dose/engineering window/implant tilt (e.g., first angle θ and second angle β). Second, this asymmetric hardmask configuration, through optimization of implant dose/engineering window/implant tilt, etc., provides a beta ratio >1, which allows greater flexibility for device and SRAM design. Third, there is no need for an additional mask or lithography step(s) during processing, i.e., the process is compatible with current 14 nm (or smaller) processes. This results in a mask cost savings by eliminating the extra mask.

Figure 4:
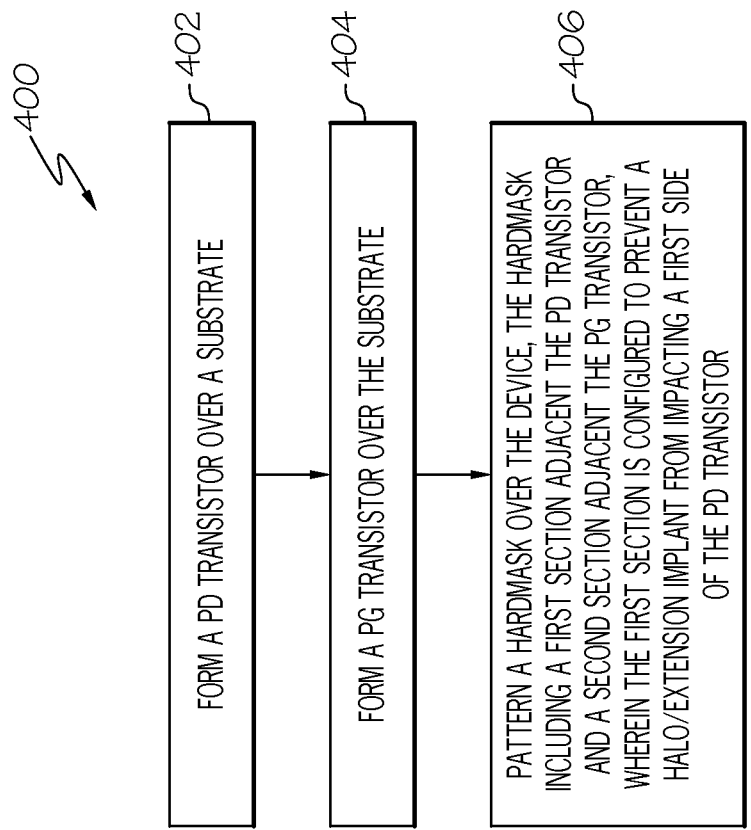
FIG. 4 shows a process flow for forming the hardmask for the halo/extension implant of the semiconductor device according to illustrative embodiments.

In various embodiments, design tools can be provided and configured to create the datasets used to pattern the semiconductor layers as described herein. For example, design tools can be used to achieve the process flow 400 shown in FIG. 4, in which: a PD transistor is formed over a substrate (i.e., 402); a PG transistor is formed over the substrate (i.e., 404); and a hardmask is patterned over the device, the hardmask including a first section adjacent the PD transistor and a second section adjacent the PG transistor, wherein the first section is configured to prevent a halo/extension implant from impacting a first side of the PD transistor (i.e., 406).

Data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that approaches have been described for forming a hardmask for a SRAM layout of a semiconductor device. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a hardmask for a halo/extension implant of a static random access memory (SRAM) layout for a semiconductor device, the method comprising:
    forming a pull-down (PD) transistor over a substrate;
    forming a pass-gate (PG) transistor over the substrate;
    patterning a hardmask over the device after forming the PD transistor and forming the PG transistor, the hardmask including a first section adjacent the PD transistor and a second section adjacent the PG transistor;
    providing a distance between the first section and the PD transistor to prevent a halo/extension implant from impacting a first side of the PD transistor; and
    implanting the semiconductor device with the halo/extension implant, wherein the halo/extension implant comprises a first implant at a first angle and a second implant at a second angle
    wherein a distance between the first section and the PD transistor is shorter than a distance between the second section and the PG transistor, and
    wherein the second section of the hardmask is patterned to allow the first implant to impact the following: the first side of the PD transistor, a second side of the PD transistor, a first side of the PG transistor, and a second side of the PG transistor, and wherein the second section of the hardmask is patterned to allow the second implant to impact the following: the first side of the PD transistor, the second side of the PD transistor, the first side of the PG transistor, and the second side of the PG transistor.

2. The method according to claim 1, further comprising forming a set of fins from the substrate, wherein the PG transistor and the PD transistor are formed over the set of fins.

3. A method for forming a hardmask for a halo/extension implant of a static random access memory (SRAM) layout for a semiconductor device, the method comprising:
    forming a pull-down (PD) transistor over a substrate;
    forming a pass-gate (PG) transistor over the substrate;
    patterning a hardmask over the device after forming the PD transistor and forming the PG transistor, the hardmask including a first section adjacent the PD transistor and a second section adjacent the PG transistor;
    providing a distance between the first section and the PD transistor to prevent a halo/extension implant from impacting a first side of the PD transistor; and
    implanting the semiconductor device with the halo/extension implant, wherein the halo/extension implant comprises a first implant at a first angle and a second implant at a second angle
    wherein a distance between the first section and the PD transistor is shorter than a distance between the second section and the PG transistor, and
    wherein the first section of the hardmask is patterned to allow the first implant to impact the following: the first side of the PD transistor, a second side of the PD transistor, a first side of the PG transistor, and a second side of the PG transistor, and wherein the first section of the hardmask is patterned to allow the second implant to impact only the following: the second side of the PD transistor, the first side of the PG transistor, and the second side of the PG transistor.

4. The method according to claim 3, further comprising forming a set of fins from the substrate, wherein the PG transistor and the PD transistor are formed over the set of fins.

5. A method for forming a hardmask for a halo/extension implant of a static random access memory (SRAM) layout for a semiconductor device, the method comprising:
    forming a pull-down (PD) transistor over a substrate;
    forming a pass-gate (PG) transistor over the substrate;
    patterning a hardmask over the device, the hardmask including a first section adjacent the PD transistor and a second section adjacent the PG transistor, wherein a distance between the first section and the PD transistor is shorter than a distance between the second section and the PG transistor;
    providing a distance between the first section and the PD transistor to prevent a halo/extension implant from impacting a first side of the PD transistor; and
    implanting the semiconductor device with the halo/extension implant, wherein the halo/extension implant comprises a first implant at a first angle and a second implant at a second angle;
    wherein the second section of the hardmask is patterned to allow the first implant to impact the following: the first side of the PD transistor, a second side of the PD transistor, a first side of the PG transistor, and a second side of the PG transistor, and wherein the second section of the hardmask is patterned to allow the second implant to impact the following: the first side of the PD transistor, the second side of the PD transistor, the first side of the PG transistor, and the second side of the PG transistor.

6. The method according to claim 5, further comprising forming a set of fins from the substrate, wherein the PG transistor and the PD transistor are formed over the set of fins.

7. A method for forming a hardmask for a halo/extension implant of a static random access memory (SRAM) layout for a semiconductor device, the method comprising:
    forming a pull-down (PD) transistor over a substrate;
    forming a pass-gate (PG) transistor over the substrate;
    patterning a hardmask over the device, the hardmask including a first section adjacent the PD transistor and a second section adjacent the PG transistor, wherein a distance between the first section and the PD transistor is shorter than a distance between the second section and the PG transistor;

providing a distance between the first section and the PD transistor to prevent a halo/extension implant from impacting a first side of the PD transistor; and implanting the semiconductor device with the halo/extension implant, wherein the halo/extension implant comprises a first implant at a first angle and a second implant at a second angle;

wherein the first section of the hardmask is patterned to allow the first implant to impact the following: the first side of the PD transistor, a second side of the PD transistor, a first side of the PG transistor, and a second side of the PG transistor, and wherein the first section of the hardmask is patterned to allow the second implant to impact only the following: the second side of the PD transistor, the first side of the PG transistor, and the second side of the PG transistor.

8. The method according to claim 7, further comprising forming a set of fins from the substrate, wherein the PG transistor and the PD transistor are formed over the set of fins.

* * * * *